United States Patent [19]
Ikeda et al.

[11] Patent Number: 5,187,602
[45] Date of Patent: Feb. 16, 1993

[54] LIQUID CRYSTAL DISPLAY APPARATUS

[75] Inventors: Mitsushi Ikeda, Kanagawa; Michio Murooka, Tokyo, both of Japan

[73] Assignee: Kabushiki Kaisha Toshiba, Kanagawa, Japan

[21] Appl. No.: 727,865

[22] Filed: Jul. 10, 1991

[30] Foreign Application Priority Data

Jul. 12, 1990 [JP] Japan .................................. 2-185736
May 30, 1991 [JP] Japan .................................. 3-127716

[51] Int. Cl.⁵ .............................................. G02F 1/13
[52] U.S. Cl. ...................................... 359/59; 359/87; 359/79
[58] Field of Search ............ 359/58, 59, 87, 79; 340/784; 357/23.7; 437/101

[56] References Cited

U.S. PATENT DOCUMENTS

| | | | |
|---|---|---|---|
| 4,385,292 | 5/1983 | Nonomura et al. | 340/719 |
| 4,759,610 | 7/1988 | Yanagisawa | 359/59 |
| 4,929,059 | 5/1990 | Takahashi | 359/59 |
| 4,948,231 | 8/1990 | Aoki et al. | 359/59 |
| 5,028,122 | 7/1991 | Hamada et al. | 359/59 |
| 5,028,551 | 7/1991 | Dohjo et al. | 437/101 |
| 5,054,887 | 10/1991 | Kato et al. | 359/59 |
| 5,060,036 | 10/1991 | Choi | 359/59 |
| 5,070,379 | 12/1991 | Nomoto et al. | 359/59 |

FOREIGN PATENT DOCUMENTS

| | | |
|---|---|---|
| 0329887 | 8/1989 | European Pat. Off. . |
| 0376437 | 7/1990 | European Pat. Off. . |
| 2118365 | 10/1983 | United Kingdom ............. 340/784 |

OTHER PUBLICATIONS

Patent Abstracts of Japan, vol. 13, No. 304 (E-786), Jul. 12, 1989, & JP-A-1 081 262 (Seiko Epson) Mar. 27, 1989.

Primary Examiner—William L. Sikes
Assistant Examiner—Huy K. Mai
Attorney, Agent, or Firm—Finnegan, Henderson, Farabow, Garrett and Dunner

[57] ABSTRACT

An object is to provide an active matrix type liquid crystal display apparatus with a substrate for a liquid crystal driving semiconductor device which is free from point defects, rise of production costs, and short-circuit in a storage capacitance portion. The liquid crystal display apparatus has a substrate for a liquid crystal driving semiconductor device with a display picture element group consisting of driving semiconductor devices 15 and storage capacitances, the display picture element group being disposed on one major surface of a transparent substrate 13, wherein the storage capacitance is formed by disposing an anodic oxide film 18 between a display electrode 16 and a storage capacitance metallic line 1b made of TaN, for example, and disposed on the one major surface of the transparent substrate 13.

14 Claims, 11 Drawing Sheets

LIQUID CRYSTAL DISPLAY APPARATUS

BACKGROUND OF THE INVENTION

1. Field of the Invention

The present invention relates to an active matrix type liquid crystal display apparatus.

2. Description of the Related Art

An active matrix type liquid crystal display (LCD) apparatus which is provided with thin film transistors (TFT's) formed with an amorphous silicon (a—Si) film as switching devices has gained public attention. By constructing a TFT array with the a—Si film which can be formed on an inexpensive glass substrate at a low temperature, a panel display (a flat type television) which features a large area, a high definition, a high picture quality, and a low cost may be provided.

Figure 1:
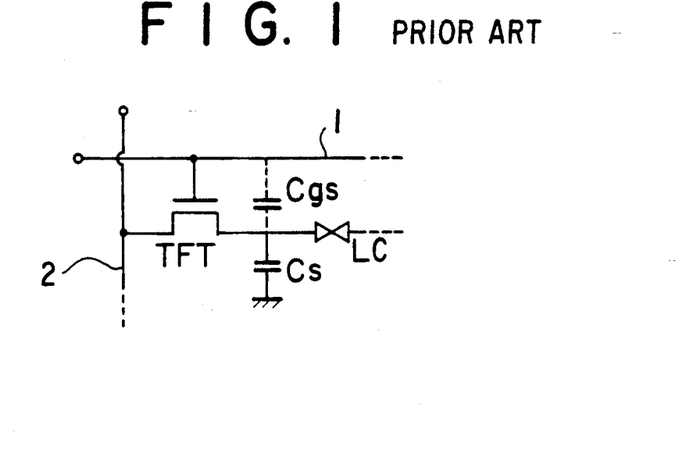
FIG. 1 is a circuit diagram showing an equivalent circuit of a picture element of a TFT-LCD.

FIG. 1 is an equivalent circuit of a picture element of a substrate for a liquid crystal driving semiconductor device used for such a liquid crystal apparatus. As shown in the figure, in switching a pixel by an address pulse, the potential of a picture element electrode drops, by coupling through a floating capacitance ($C_{gs}$) between the gate and the source of the TFT. To prevent the potential drop of the picture element, a storage capacitance ($C_s$) is disposed in parallel with a liquid crystal layer (LC). In FIG. 1, reference numeral 1 is an address line and reference numeral 2 is a data line.

Figure 2:
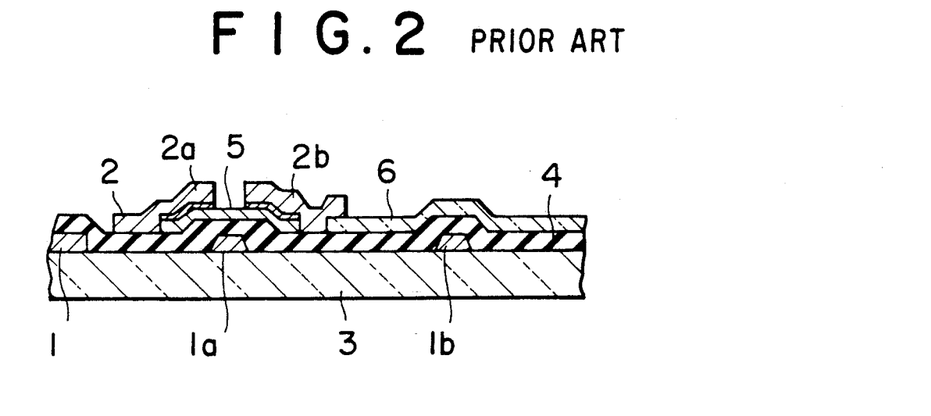
FIG. 2 is a sectional view showing an example of a construction of the principal portion of a substrate for liquid crystal driving semiconductor device with which a conventional liquid crystal display apparatus is provided.

The sectional view of the substrate for the liquid crystal driving semiconductor device array which constitutes the above mentioned picture element circuit is shown in FIG. 2, for example. In other words, an address line 1; a gate electrode line 1a which is connected to the address line 1; a storage capacitance line 1b, which are connected to the address line 1; an insulator film 4, which covers the address line 1, the gate electrode line 1a, and the storage capacitance line 1b; a TFT semiconductor thin film 5, which is formed on the insulator film 4 over the gate electrode line 1a; a drain electrode 2a and a source electrode 2b, which are formed on both the ends of the TFT semiconductor thin film 5; a display electrode 6, which is formed on the insulator film 4 over the storage capacitance line 1b for providing a storage capacitance between the storage capacitance line 1b and the display electrode 6; and a data line 2, which is formed nearly perpendicularly to the address line 1 on the insulator film 4 are disposed on one surface of a glass substrate 3. The TFT drain electrode 2a is connected to the data line 2. The source electrode 2b is connected to the display electrode 6.

In the above mentioned construction, light does not penetrate into the storage capacitance line 1b. Thus, the aperture ratio is adversely decreased by the area of storage capacitance line 1b. Consequently, a requirement for decreasing the area of the storage capacitance line 1b as small as possible arises.

Moreover, in the liquid crystal driving semiconductor device substrate, a distortion of the wiring pattern may cause a shortcircuit between the data line 2 and the display electrode 6 and thereby a point defect takes place. Thus, as shown by a sectional view of FIG. 3, the display electrode 6 and the insulator film 4 which is formed under the display electrode 6 (hereinafter the insulator film 4 is named the first insulator film) are coated with a second insulator film 7 except for the portion for connecting the display electrode 6 and the source electrode 2b. The second insulator film 7 prevents such a point defect from taking place.

Figure 3:
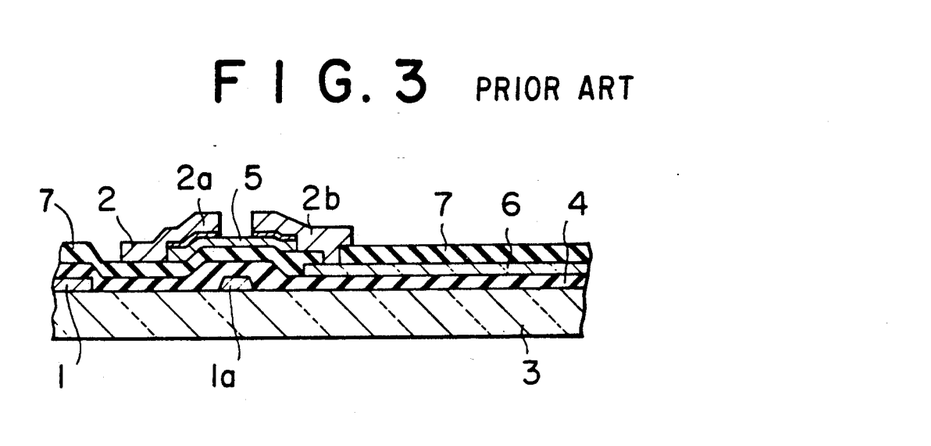
FIG. 3 is a sectional view showing an example of another construction of the principal portion of a substrate for liquid crystal driving semiconductor device with which a conventional liquid crystal display apparatus is provided.

However, in the above mentioned construction, since the inter-layer insulator film is formed with two layers of the first insulator film 4 and the second insulator film 7, the following drawbacks result. Normally, the second insulator film 7 is formed by a CVD method or plasma CVD method. Since such equipment is expensive, two depositions of CVD film will increase the production cost. In addition, to properly set the thickness of the insulator film between the gate electrode line 1a and the semiconductor thin film 5, it is necessary to decrease the thickness of the first insulator film 4. Thus, a shortcircuit tends to take place between the display electrode 6 and the storage capacitance line 1b.

In the above construction of the substrate for liquid crystal driving semiconductor device the storage capacitance Cs can be expressed by the following equation.

$$C_s = \epsilon_0 \times \epsilon_s \times S/d$$

Wherein $\epsilon_s$ is the dielectric constant of the insulator film, d being the film thickness, S being the area of the electrode, and $\epsilon_0$ being the dielectric constant of a vacuum.

To obtain a large capacitance, it is preferable to increase the dielectric constant of the insulator film, $\epsilon_s$, and the area of the electrode, S, and to decrease the film thickness of the insulator film, d. However, the dielectric constant of the insulator film, $\epsilon_s$, depends on the material. For conventionally used films, in the case of $SiO_x$, the dielectric constant is 4. In the case of $SiN_x$, it is 7. In other words, it is difficult to obtain a large value of the dielectric constants when $SiO_x$ and $SiN_x$, are used. Moreover, the film thickness, d, cannot be remarkably decreased due to restrictions of the breakdown voltage, leak current, and the pin hole density. The area of the electrode, S, should be decreased so as to improve the aperture ratio. Thus, an insulator film with a high dielectric constant is required. In addition, the increase of the aperture ratio is further required with decreasing the size of picture elements. When data is written, a data voltage drop by the following equation takes place.

$$\Delta V_d = C_{gs} \times V_s (C_{LC} + C_S + C_{gs})$$

(where $\Delta V_d$ is a voltage drop due to an address pulse switching; $C_{gs}$ is a floating capacitance between the gate and the source; $C_{LC}$ is a capacitance of the liquid crystal layer; $C_s$ is the value of storage capacitance; and $V_g$ is a gate pulse voltage.) To decrease the voltage drop, the value of the storage capacitance $C_s$ should be large. Since $\Delta V_d$ causes a DC component in the liquid crystal, $\Delta V_d$ should be 1% or less of the data voltage, $V_d$. In the conventional LCD, since $C_{gs}$, is around 0.1 pF and $C_{LC}$ is around 0.2 pF, $C_s$ should be 100 $C_{gs}$, that is, around 10 pF. In addition, as the data holding time ($\tau = C_s$ R), is required 5 times of the frame time, namely $5 \times 33$ ms, to reduce flickers. Thus, normally, $C_s$ R should be greater than or equal to $5 \times 33$ ms.

On the other hand, since $C_S R = (\epsilon_0 \times \epsilon_s/d) \times S \times (d/S) \times \rho = \epsilon_0 \times \epsilon_s \times \rho$, then $$\epsilon_s \times \rho \geq 1.9 \times 10^{12}$$

Thus, in the case of $SiO_2$ ($\epsilon_s = 4$), $\rho \geq 4.7 \times 10^{11}$ $\Omega$cm; in the case of SiN ($\epsilon_s = 7$), $\rho \geq 2.7 \times 10^{11}$ $\Omega$cm; and in the case of TaO ($\epsilon_s=30$), $\rho \geq 6.2 \times 10^{10}$ Ωcm. However, actually, R is a parallel resistance of $R_{cs}$ and the off resistance of the TFT, $R_{off}$. Thus, the resistance should be twice the above mentioned value. For example, when TaO is utilized, $\rho \geq 1.2 \times 10^{11}$ Ωcm. However, in the case of TaO, since $\rho$ is in the range from $3 \times 10^9$ Ωcm to $5 \times 10^{10}$ Ωcm, the above condition is not satisfied. In other words, to increase the value of the storage capacitance, $C_s$, it is necessary to use a material with a large value of the dielectric constant $\epsilon_s$ and a large value of the resistivity $\rho$.

To prevent a point defect due to a distortion of the wiring pattern, a substrate for liquid crystal driving semiconductor device where the display electrode 6 is coated with an insulator film has been studied. However, in such a construction, two layers as the interlayer insulator film should be deposited by means of the CVD method or the plasma CVD method which requires expensive equipment. In addition, a shortcircuit tends to take place between the storage capacitance line 1b and the display electrode 6. On the other hand, there is a requirement of decreasing the area of the storage capacitance line 1b as small as possible so as to prevent the aperture ratio from decreasing.

Therefore, an object of the present invention is to provide a liquid crystal display apparatus with a storage capacitance line having a small area so as to improve the aperture ratio.

Another object of the present invention is to provide a liquid crystal display apparatus for clearly displaying a picture with small picture elements for accomplishing a high definition display.

Another object of the present invention is to provide a liquid crystal display apparatus for completely preventing a shortcircuit between a storage capacitance line and a display electrode.

Another object of the present invention is to provide a liquid crystal display apparatus which can be produced with a high cost performance.

SUMMARY OF THE INVENTION

The liquid crystal display apparatus according to the present invention has a substrate for a liquid crystal driving semiconductor device with display picture elements having driving thin film transistors and storage capacitance devices, the display picture elements being disposed on one major surface of a transparent substrate, wherein the storage capacitance device comprises a storage capacitance metallic line made of a metal containing Ta and N, the storage capacitance metallic line being disposed on the one major surface of the transparent substrate, an anodic oxide of the metal film formed on the surface of the storage capacitance metallic line, and a display electrode formed in contact with the anodic oxide film.

The metal containing Ta and N according to the present invention, contains at least one metal selected from a group of Ta—N, Mo—Ta—N, W—Ta—N, Nb—Ta—N, Al—W—Ta—N, Al—Nb—Ta—N, Ti—W—Ta—N, Ti—Nb—Ta—N, Zr—W—Ta—N, and Zr—Nb—Ta—N.

Since the dielectric constant of the metallic anodic oxide film of the liquid crystal display apparatus according to the present invention is larger than that of a $SiO_x$ film and a $SiN_x$ film made by the conventional CVD method and the plasma CVD method, the area of the storage capacitance electrode can be decreased and thereby improve the aperture ratio. The dielectric constant of the $SiO_x$ film is 4 and that of the $SiN_x$ film is 7. In contrast, the anodic oxide films have a high dielectric constant. In other words, the dielectric constant of an $AlO_x$ film is 8; that of a $TaO_x$ is 30; that of a Ta—N—O film ranges from 10 to 30; that of a $TiO_x$ film is 80; and that of a $ZrO_x$ film is 9.

In addition, since the anodic oxide films may be formed with inexpensive equipment, the liquid crystal display apparatus can be produced at a lower cost than that which uses the insulator films formed by means of the conventional CVD plasma method and the CVD method.

Moreover, since the metallic anodic oxide film is free from pin holes, even if it is formed as a thin film, a shortcircuit does not take place between the storage capacitance line and the picture element electrode. In other words, since the CVD film and the plasma CVD film are formed by deposition, occurrence of pin holes due to deposited particles is inevitable. In contrast, since the anodic oxide film is oxidized from its surface, it has a self repair action and thereby pin holes do not take place. Thus, even if the anodic oxide film is formed as a thin film, no defects take place.

BRIEF DESCRIPTION OF DRAWINGS

FIG. 9(a-b) is a chart showing the relationship between the resistivity of a Ta layer formed on a Ta—Nb—N film and the composition thereof;

DESCRIPTION OF PREFERRED EMBODIMENTS

Now, with reference to the accompanying drawings, embodiments according to the present invention will be described.

EMBODIMENT 1

Figure 4:
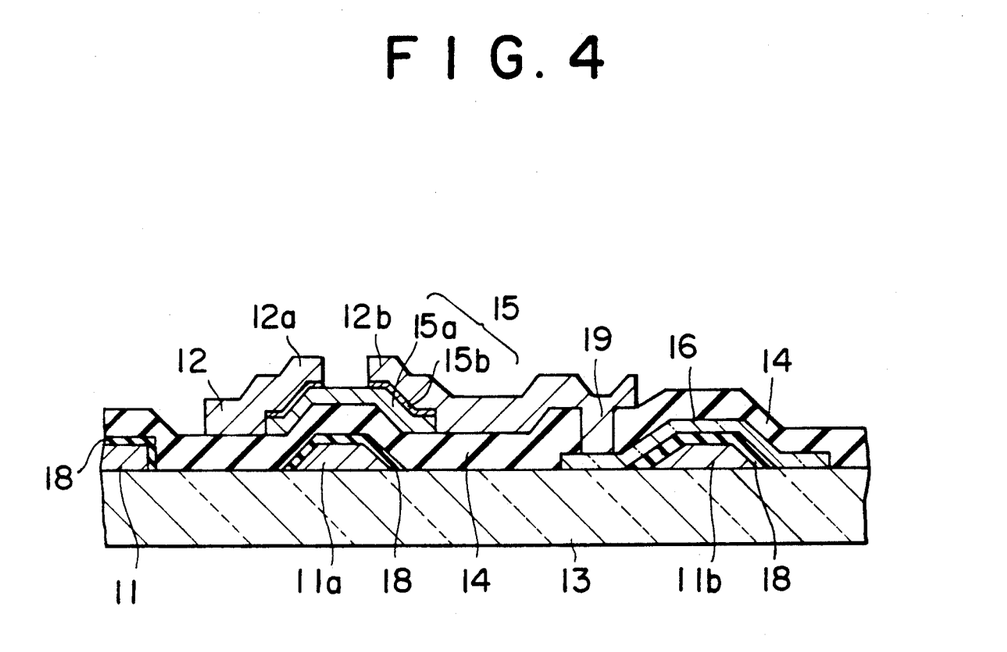
FIG. 4 is a sectional view showing an example of a construction of the principal portion of a substrate for a liquid crystal driving semiconductor device with which a liquid crystal display apparatus according to the present invention is provided.

FIG. 4 is a sectional view showing a construction of the principal portion of a substrate for a liquid crystal driving semiconductor device used in an embodiment according to the present invention.

A gate electrode line 11a, a storage capacitance line 11b, and an address line 11 which are made of a metallic wiring material, for example, $Ta_{0.8}N_{0.2}$, are disposed on one surface of a transparent substrate 13, which is, for example, a glass substrate. The surfaces of the lines 11a, 11b, and 11 are coated with an anodic oxide film 18, for example, a Ta—N—O film.

On the metal anodic oxide film 18 over the storage capacitance line 11b, a display electrode 16 is formed with a display electrode material, for example, ITO ($In_2O_3$-$SnO_2$). The display electrode 16 and the gate electrode line 11a are coated with an insulator film 14, for example, an $SiO_x$ film. An a—Si film 15a and an n+a—Si film 15b, for example, are formed in that order on the gate electrode line 11a through the insulator film 14. At both the ends of the semiconductor thin film 15, a drain electrode 12a and a source electrode 12b are formed of Al/Mo, for example. The drain electrode 12a is connected to a data line 12 formed on the insulator film 14. The source electrode 12b is connected to the display electrode 16 through a through-hole 19 made in the insulator film 14 disposed on the display electrode 16. Thereafter, the n+a—Si film is removed at a channel portion and thereby a TFT is formed.

With respect to the metal anodic oxide film of the substrate for the liquid crystal driving semiconductor device constructed in the above mentioned manner, the dielectric constant of a TaNO film is in the range from 10 to 30 and that of a $TaO_x$ film is 30. In contrast, the dielectric constant of a $SiO_x$ film is 4 and that of a $SiN_x$ film is 7. In other words, the dielectric constant of the former is larger than that of the latter. Thus, the area of the storage capacitance line 11b can be decreased (when a $TaO_x$ film is used, its area can be decreased to approx. 1/7 times that of the $SiO_x$ film; and when a $(Ta_{0.8}N_{0.2})_xO_y$ film is used, its area can be decreased to approx. 1/6 times that of the $SiO_x$ film). Thus, the aperture ratio can be accordingly improved.

As an anodic oxide film, it is possible to use the $TaO_x$ film instead of the TaNO film. However, in this construction, since the leak current becomes large, it is necessary to raise the anodization voltage of the anode film to around 200 V so as to satisfy the condition imposed on ρ. Thus, the thickness of the $TaO_x$ film becomes twice that of the TaNO film, and the capacitance is reduced by a half. In addition, the step between lines becomes large, thus causing the data line to break.

Figure 5:
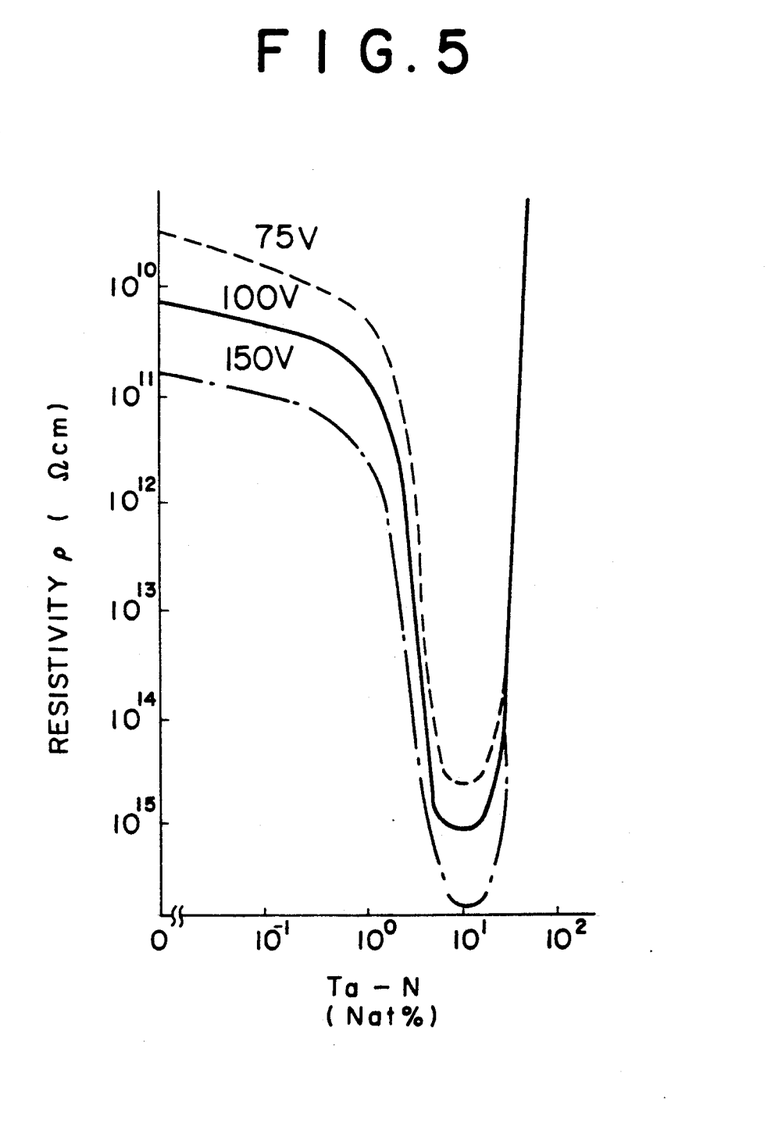
FIG. 5 is a chart showing the relationship between the resistivity and the composition of a $TaN_x$ anodic oxidization film.

FIG. 5 shows the dependence of resistivity of the TaNO film upon the composition and anodization voltage. When the leak current of the storage capacitance is calculated by using a required resistivity, it should be $2 \times 10^{-6}$ A/cm$^2$ or less (the resistivity should be $1.2 \times 10^{11}$ Ωcm or greater). These values vary to some extent depending on the size of TFT, the frame frequency, and so forth. As shown in FIG. 5, when using the $TaNO_x$ film where 1 atomic % of N is added to Ta, even if the anodization voltage is 100 V, the condition of the leak current is satisfied. In contrast, when using the $TaO_x$ film where N is not added, even if the anodization voltage is 150 V, the condition of the leak current is not satisfied. Thus, when the insulator film is formed with $TaNO_x$, since the thickness can be decreased, it is possible to provide it with large storage capacitance while using the same surface area. When the $TaO_x$ film is utilized, the leak current readily increases depending on the sputter condition of Ta and the presence of a small amount of impurities. However, when N is added to the $TaO_x$ film, the leak current becomes stable with a small value.

Figure 6:
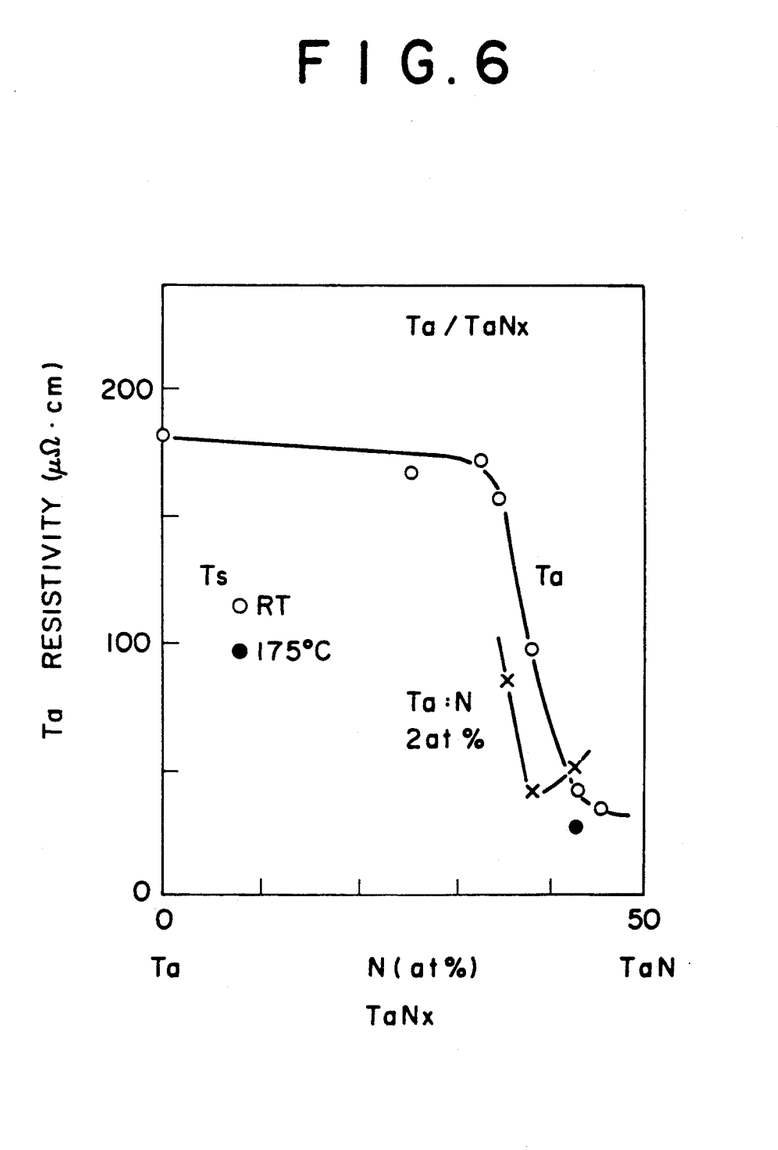
FIG. 6 is a chart showing the relationship between the resistivity of a Ta layer and a layer of Ta containing 2 atomic % of N, both formed on a $TaN_x$ film, when the composition of the $TaN_x$ film is changed.

FIG. 6 shows the relationship between the composition and the resistivity in the case where a Ta layer formed with a lower layer film of $TaN_x$ and an upper layer where Ta is sputtered thereon, is changed from β-Ta with high resistivity to α-Ta with low resistivity. In the Ta/$TaN_x$ and Ta containing 2 atomic % of N/$TaN_x$ construction, the resistance of the lines can be decreased.

Figure 7:
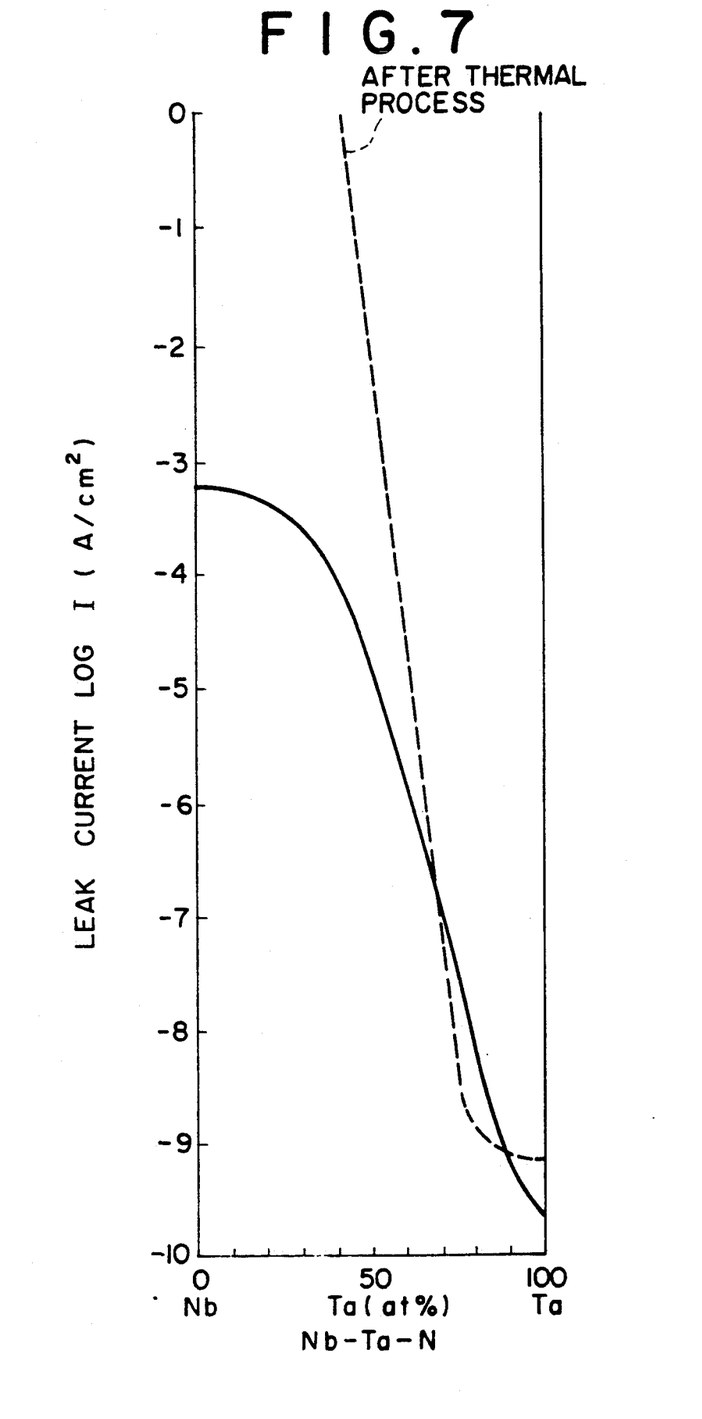
FIG. 7 is a chart showing the relationship between the leak current of an anodic oxide film of a Ta—Nb—N film and the composition thereof.
Figure 8:
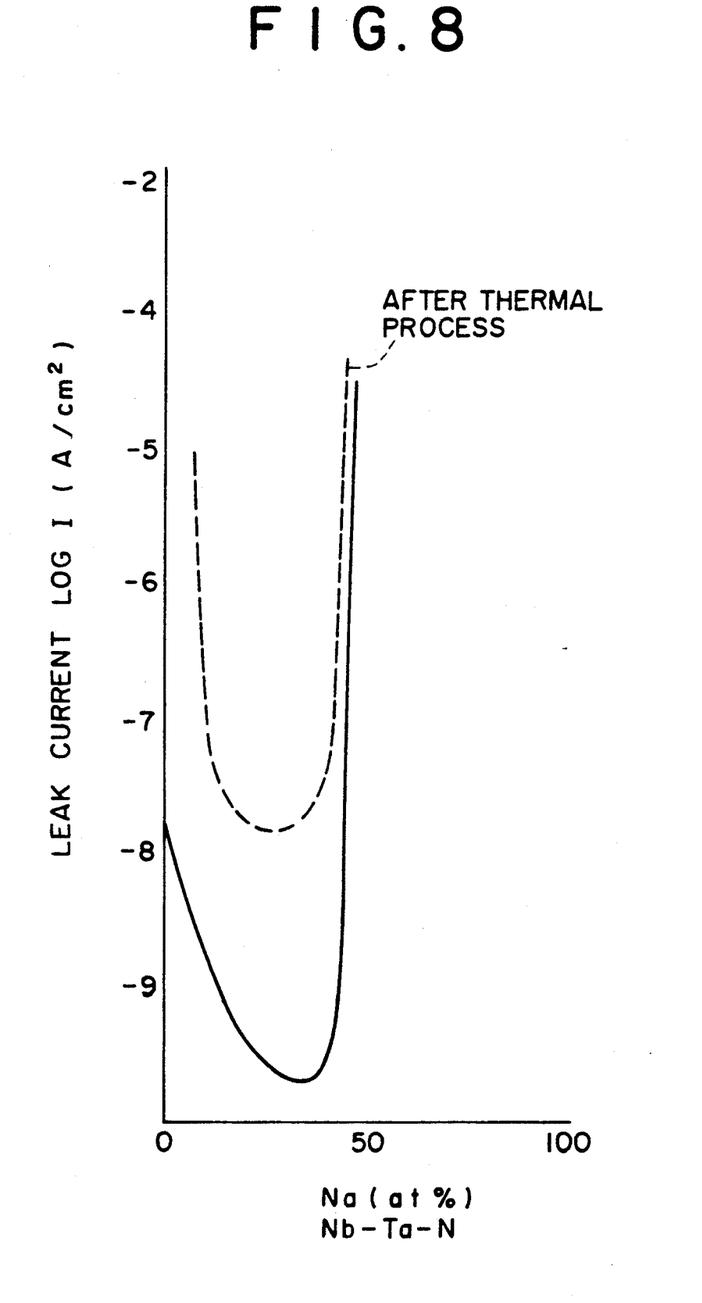
FIG. 8 is a chart showing the relationship between the leak current of an anodic oxide film of a T—Nb—N film and the composition thereof.
Figure 9A:
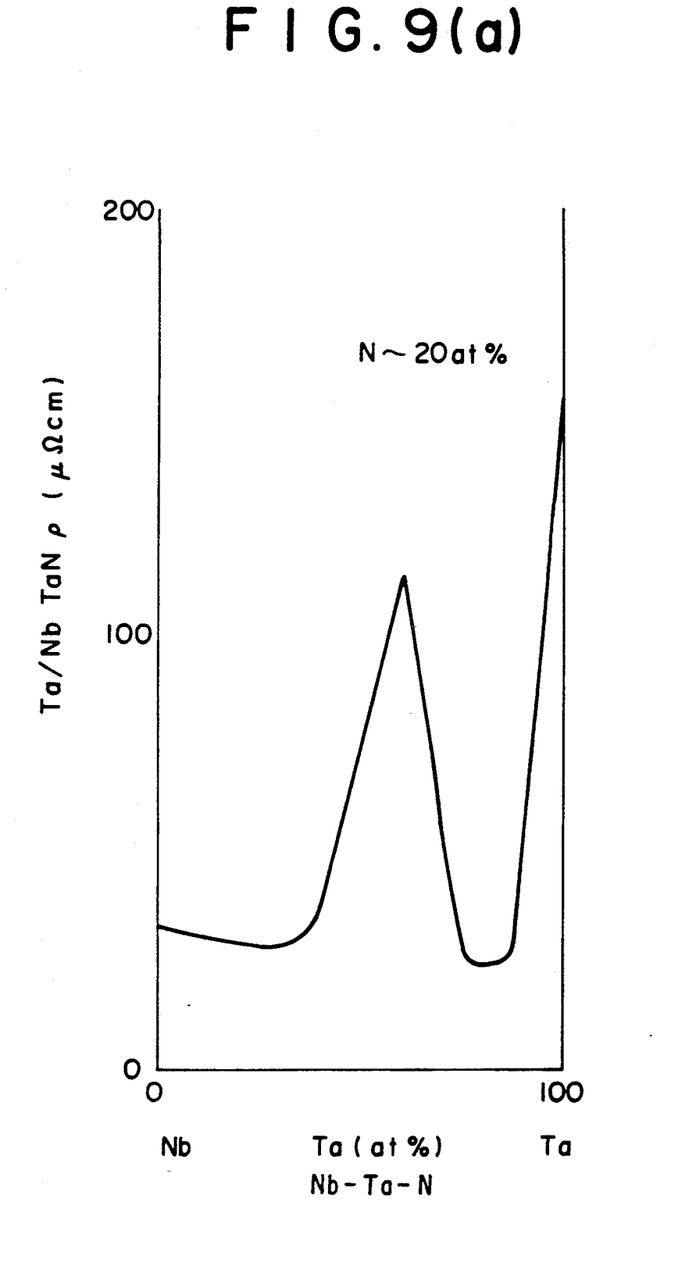
Figure 9B:
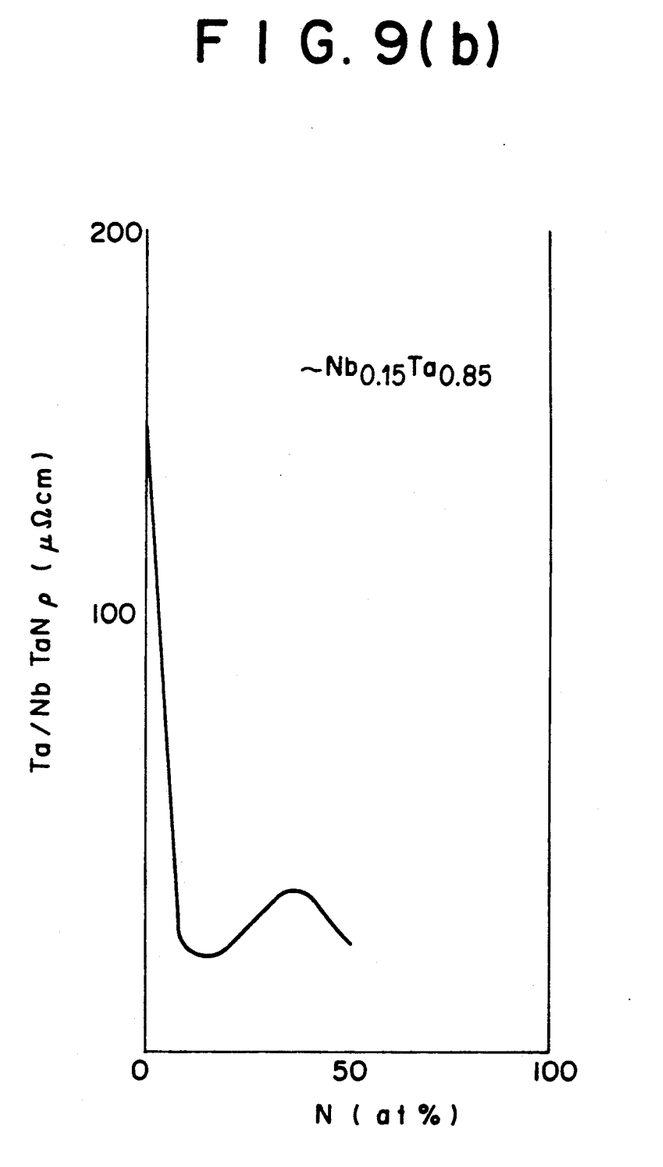

FIGS. 7 and 8 show that the leak current of anodic oxide films of an Nb—Ta alloy compound including N (in FIG. 7, $Nb_xTa_yN_{0.2}$; and in FIG. 8, $(Ta_{0.85}Nb_{0.15})_xN_y$) tends to decrease with increasing N like the case of $TaN_x$. FIGS. 9 (a) and 9 (b) show the relationship between the composition of the lower layer film of $NbTaN_x$ and the resistivity of the Ta layer formed as the upper layer. In this construction (lamination), the resistance of the Ta layer becomes low. In other words, when Nb is alloyed, even if the additive amount of N is small (10 atomic % or less), the resistance of Ta becomes low. Thus, as a metal of the lower layer, a Ta—Nb—N film, a Ta—Mo—N alloy film, a Ta—W—N alloy film, and so forth, can be used where the leak current of the anodic oxide film is small. Although the amount of N which satisfies the above mentioned condition also depends on the production condition, it is preferably in the range from 5 to 45 atomic %. In addition, the amounts of Nb, Mo, and W are preferably up to 50 atomic %.

With reference to FIG. 4, an example of the production of the above mentioned substrate for liquid crystal driving semiconductor device will be described.

A metallic wiring material, for example, Ta—N, is layered with a thickness of 300 nm by a sputtering method on the transparent substrate 13 which is, for example, a glass substrate. Thereafter, the metallic wiring material is patterned and then etched so as to form the gate electrode line 11a, the storage capacitance line 11b, and the address line 11.

Thereafter, the electrode 11a, 11b, and 11 are oxidized in a citric acid solution with a constant current of 0.5 mA/cm² until the voltage becomes 100 V. Thereafter, the lines 11a, 11b, and 11 are oxidized with a constant voltage of 100 V. Thus, the anodic oxide film 18, for example, a TaNO film with a thickness of 200 nm, is formed on the surfaces of the lines 11a, 11b, and 11. Thereafter, a display electrode material, for example, an ITO film with a thickness of 100 nm, is formed on the anodic oxide film 18 over the storage capacitance line 11b by the sputtering method. Thereafter, the display electrode material is patterned and then etched so as to form the display electrode 16. Thereafter, a $SiO_x$ film with a thickness of approx. 300 nm is formed by, for example, the plasma CVD method. In a particular position on the $SiO_x$ film, the through-hole 19 is made by, for example, the etching process.

The a—Si film 15a with a thickness of 300 nm and the n+ a—Si film 15b with a thickness of 50 nm are formed in that order on the insulator film 14 by, for example, the plasma CVD method so as to form an island of a—Si. Thereafter, electrode materials, for example, Mo and Al, are formed with a thickness of approx. 1 μm by the sputtering method. Thereafter, the line materials are patterned and then etched so as to form the drain electrode 12a, the source electrode 12b, and the data line 12. Thereafter, the n+ a—Si film 15b at the channel portion is etched and thereby the substrate for liquid crystal driving semiconductor device in the above mentioned construction is produced.

Figure 10:
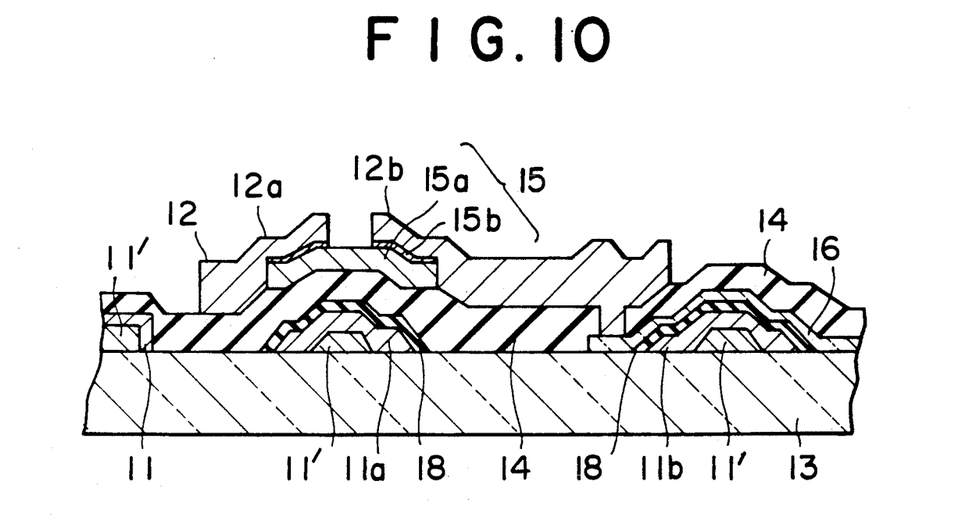
FIG. 10 is a sectional view showing an example of another construction of the principal portion of a substrate for a liquid crystal driving semiconductor device with which a liquid crystal display apparatus according to the present invention is provided.

FIG. 10 shows another example of a construction of the substrate for a liquid crystal driving semiconductor device. In this construction, an Al film 11' is formed on the transparent substrate 13 which is, for example, a glass substrate, by the sputtering method so as to decrease the resistance of the lines. Thereafter, the Al film 11' is patterned and then coated with Ta, $TaN_x$, or the like. Thereafter, the substrate is produced in the same manner as the above mentioned embodiment. In this example, it is possible to use Cu, Au, Pt and an alloy made of these metals or the like instead of Al. In addition, it is possible to form a $TaN_x$ film on the entire surface of the substrate and to anodically oxidize the Al so that it becomes transparent.

EMBODIMENT 2

Figure 11:
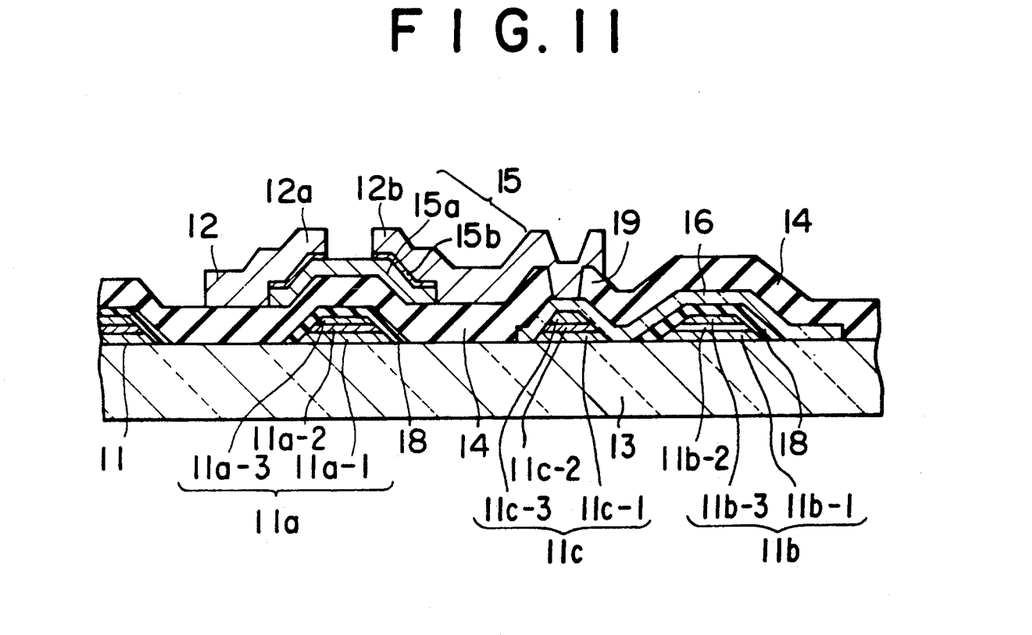
FIG. 11 is a sectional view showing an example of another construction of the principal portion of a substrate for a liquid crystal driving semiconductor device with which a liquid crystal display apparatus according to the present invention is provided.

FIG. 11 is a sectional view showing a substrate for a liquid crystal driving semiconductor device of another embodiment according to the present invention. In this embodiment, so as to decrease the resistance of the address line, alloys 11a-1, 11b-1, and 11c-1 which are compounds including one of Ta—N, Mo—Ta—N, Nb—Ta—N, W—Ta—N, or an alloy of a combination thereof are deposited as base metals 30 nm thick on the glass substrate 13, for example. Thereafter, the Ta layers 11a-2, 11b-2, and 11c-2 with a low resistance are laminated to 170 nm the alloys 11a-1, 11b-1, and 11c-1, respectively. In addition, so as to increase the resistivity of the anodic oxide film, alloy layers 11a-3. 11b-3, and 11c-3 which are compounds including one of Ta—N, Mo—Ta—N, Nb—Ta—N, or W—Ta—N are laminated to 100 nm on the Ta layers 11a-2, 11b-2, and 11c-2, respectively. Thereafter, the surfaces of the alloy layers 11a-3, 11b-3, and 11c-3 are anodically oxidized. Thereafter, in the same manner as the above embodiment 1, the substrate is produced.

As shown in FIGS. 6, 9 (a), and 9 (b), with respect to Ta, a tetragonal Ta (β-Ta) is normally formed by the sputtering method. However, by laminating Ta on the base metal layers 11a-1, 11b-1, and 11c-1, a cubic Ta (α-Ta) layers 11a-2, 11b-2, and 11c-2 with a low resistance can be formed. In addition, the anodic oxide films of the alloys 11a-3, 11b-3, and 11c-3 where N is alloyed with Ta, Mo—Ta, Nb—Ta, or W—Ta, and which are formed on the Ta layers 11a-2, 11b-2, and 11c-2, have a high insulator resistance like the $TaN_x$ anodic oxide film. In this example, by using a double layered construction of the alloy layers 11a-1, 11b-1, and 11c-1, and the Ta layers 11a-2, 11b-2, and 11c-2 without laminating an alloy compound of a metal and N on the surface, and by setting the anodization voltage to around 200 V, the same effect can be obtained. Certainly, it is possible to add a small amount of N to the Ta layers.

In selective etching of the insulator layer 14 forming the upper layer, the base metal layers 11a-1, 11b-1, and 11c-1 function as etching stoppers of the glass substrate 13.

EMBODIMENT 3

Figure 12:
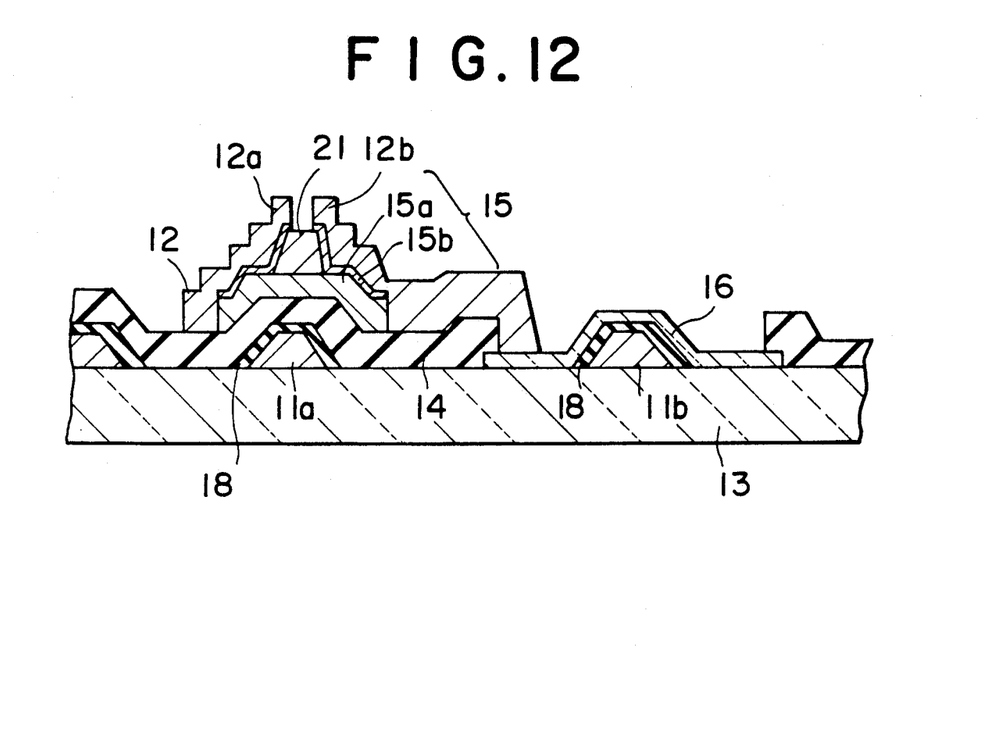
FIG. 12 is a sectional view showing an example of another construction of the principal portion of a substrate for a liquid crystal driving semiconductor device with which a liquid crystal display apparatus according to the present invention is provided.
Figure 13:
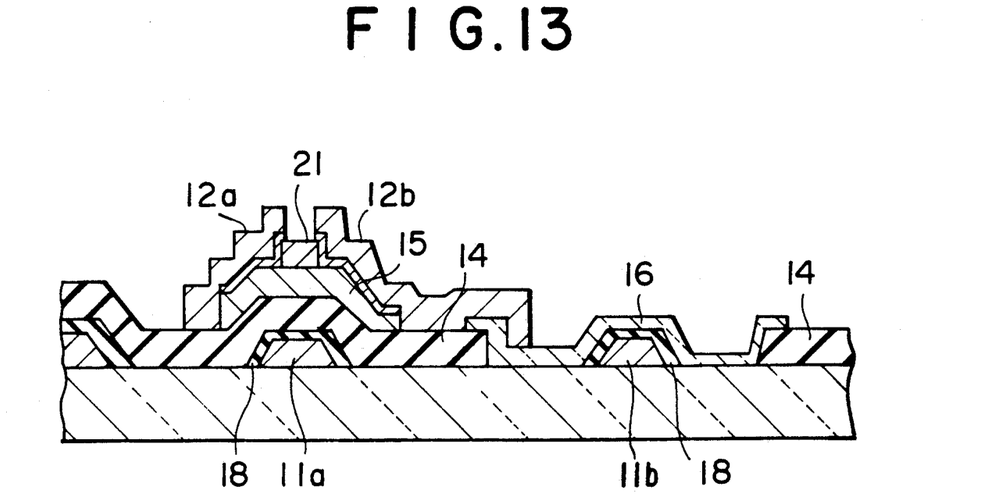
FIG. 13 is a sectional view showing an example of another construction of the principal portion of a substrate for a liquid crystal driving semiconductor device with which a liquid crystal display apparatus according to the present invention is provided.
Figure 14:
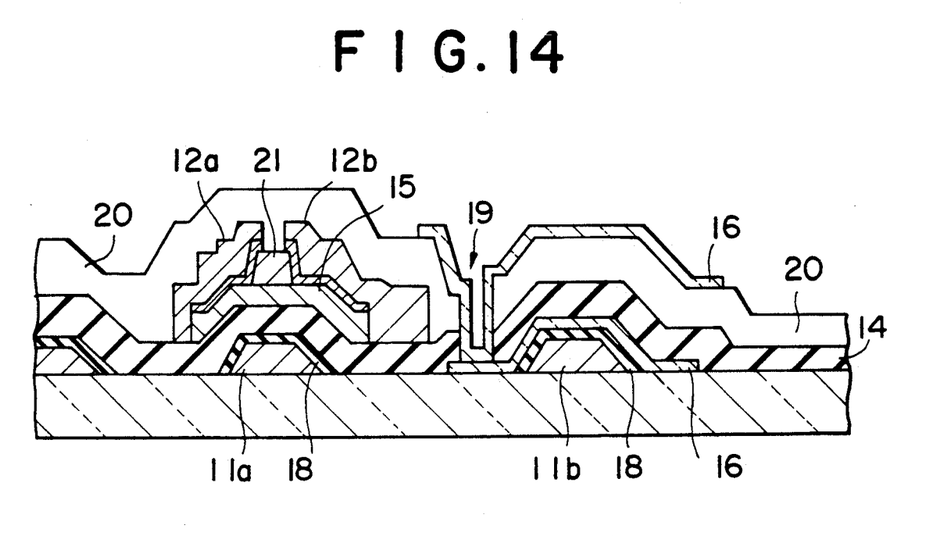
FIG. 14 is a sectional view showing an example of another construction of the principal portion of a substrate for a liquid crystal driving semiconductor device with which a liquid crystal display apparatus according to the present invention is provided.
Figure 15:
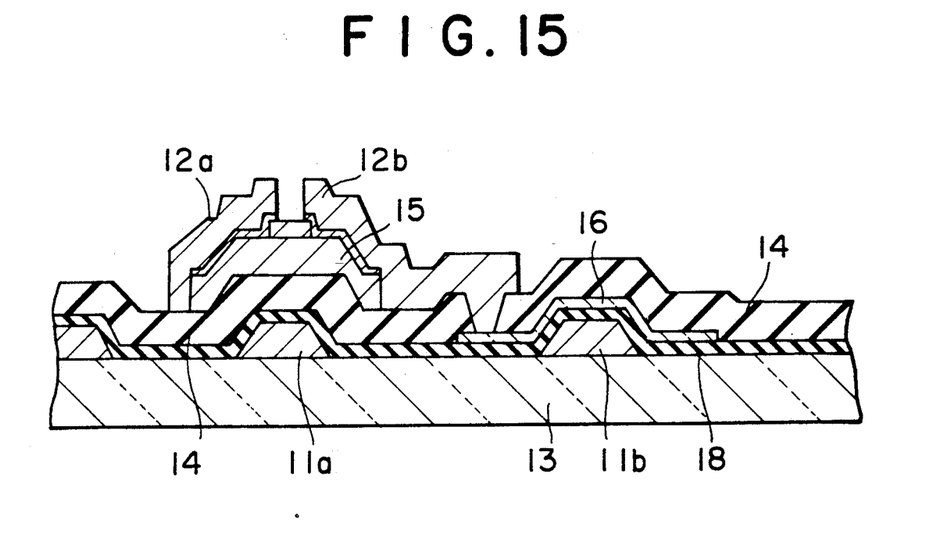
FIG. 15 is a sectional view showing an example of another construction of the principal portion of a substrate for a liquid crystal driving semiconductor device with which a liquid crystal display apparatus according to the present invention is provided.

FIG. 12 is a sectional view showing a substrate for a liquid crystal driving semiconductor device of another embodiment according to the present invention. The substrate is produced and constructed using a process similar to that of the above mentioned embodiments except that after the TFT is formed, the insulator film of the picture element portion is etched and removed so as to prevent a voltage applied to a liquid crystal of an insulator film on the display electrode 16 made of ITO, from decreasing. FIG. 13 shows an example of a substrate which is constructed in the manner that the gate insulator film of the storage capacitance $C_s$ is removed and then the display electrode 16 made of ITO is formed. On the other hand, FIG. 14 shows an example of a construction where a passivation insulator film 20 is formed besides the electrode 16 for the storage capacitance $C_s$ and then the display electrode 16 is formed on the surface so as to remove a gap of the display portion. In addition, as shown in FIG. 15, it is possible to coat most of the array rather than only the display portion with the insulator film 18' which is TaNO or the like. In any case, the liquid crystal display apparatus is formed by injecting liquid crystal between the array substrate (substrate for liquid crystal driving semiconductor device) and the counter electrode plate. In FIGS. 12 to 15, reference numeral 21 is a stopper insulator film disposed on the surface of the semiconductor thin film 15.

The present invention is not limited to the above mentioned embodiments. In other words, as a TFT, the channel portion may be constructed not only in back channel cut type where the channel portion is etched, but in the type where a stopper made of an insulator film is disposed on the channel. Moreover, a staggered type where the gate is disposed at the top may be used. Furthermore, the semiconductor may be not only a—Si, but p—Si and CdSe. The insulator film at the display portion on ITO can be etched and then removed.

In addition, the gate electrode line 11a, the storage capacitance line 11b, and the address line 11 may be not only Ta and $TaN_x$, but a metal which can be anodically oxidized Examples of the metals which can be anodically oxidized are Ta, Mo—Ta, W—Ta, Ta—N, Al, Ti, Zr, and alloys thereof. Moreover, the lines 11a, 11b, and 11 may be laminates of such materials. The solution used for anodic oxidation such metals and alloys may be not only citric acid, but phosphoric acid. In any case, the solution to be used for anodic oxidation may be a solution suitable for the metals in use.

The insulator film 14 may be not only $SiO_x$ formed by the plasma CVD method, but $SiO_x$ and $SiN_x$ formed by various film forming methods or lamination films thereof. The display electrode may be not only ITO, but also a metal.

As was described above, in the liquid crystal display apparatus according to the present invention, since the dielectric constant of the anodic oxide film is high, the area of the storage capacitance electrode can be decreased and thereby the aperture ratio can be accordingly improved. For example, the area of the storage capacitance electrode according to the present invention is remarkably decreased in comparison with that of the insulator film of $SiO_x$ or $SiN_x$. For example, with a picture element whose one side is 40 μm, the aperture ratio is improved by about 100%. In addition, since the liquid crystal display apparatus according to the present invention uses the anodic oxide film which is free from pin holes and which can be formed by inexpensive equipment, it is free from defect. In addition, the production cost does not rise. Moreover, shortcircuiting does not take place in the storage capacitance portion.

In addition, by the comparison of the constructions shown in FIGS. 3 and 4, in the conventional construction where the display electrode 6 is buried (FIG. 3), since the thickness of the insulator film which sandwiches the display electrode 6 is thinner than that of the gate insulator film, pin holes tend to take place and thereby the leak current increases in comparison with each construction according to the present invention (FIG. 4), where the thickness of the insulator film on the display electrode 16 is the same as that of the gate insulator film except for the anodic oxide film. Thus, in the conventional construction, the probability of the occurrence of a shortcircuit between the picture element electrode and the data line whose pattern deviates and that between the display electrode 6 and the gate line increase. Against such problems, in each construction according to the present invention, since the insulator film on the display electrode 16 can become satisfactorily thick and the anodic oxide film on the storage capacitance $C_s$ line has good quality and high dielectric constant, a sufficient insulator can be attained without loss of the "on" current of the TFT.

What is claimed is:

1. A liquid crystal display apparatus comprising:
   a transparent substrate;
   driving thin film transistors disposed on said transparent substrate;
   display picture elements, each connected to a respective one of said driving thin film transistors; and
   storage capacitance devices, each connected in parallel with a corresponding one of said display picture elements, wherein each of said storage capacitance devices includes
   a storage capacitance metallic line made of a metal containing Ta and N, said storage capacitance metallic line being disposed on said transparent substrate, and
   a metal oxide film formed by anodically oxidizing the surface of said storage capacitance metallic line, and
   wherein the corresponding one of said display picture elements is disposed on said metal oxide film.

2. The liquid crystal display apparatus as set forth in claim 1, wherein the metal containing Ta and N, contains at least one metal selected from a group of Ta—N, Mo—Ta—N, W—Ta—N, Nb—Ta—N, Al—W—Ta—N, Al—Nb—Ta—N, Ti—W—Ta—N, Ti—Nb—Ta—N, Zr—W—Ta—N, and Zr—Nb—Ta—N.

3. The liquid crystal display apparatus as set forth in claim 1, wherein the metal containing Ta and N is $Ta_{0.8}N_{0.2}$.

4. The liquid crystal display apparatus as set forth in claim 1, wherein the metal containing Ta and N is $Ta_{0.85}N_{0.15}$.

5. The liquid crystal display apparatus as set froth in claim 1, wherein the metal containing Ta and N is laminated with one or more layers of Ta—N, Nb—Ta—N, Ta—Mo—N, Ta—W—N, or Ta—Nb—N.

6. The liquid crystal display apparatus as set forth in claim 1, wherein the content of N of the metal containing Ta and N, is 45 atomic % or less.

7. The liquid crystal display apparatus as set forth in claim 1, wherein a metal layer selected from a group of Al, Cu, Au, and Pt is formed as a bottom layer of the metal containing Ta and N.

8. The liquid crystal display apparatus as set forth in claim 1, wherein said metal oxide film contains a metal selected from a group of Ta, Al, Mo—Ta, W—Ta, Nb—Ta, Al—W—Ta, Ti—W—Ta, Zr—W—Ta, and Zr—Nb—Ta.

9. The liquid crystal display apparatus as set forth in claim 8, wherein said metal oxide film is Ta—O or Ta—N—O.

10. The liquid crystal display apparatus as set forth in claim 8, wherein said metal oxide film is $(Ta_{0.8}N_{0.2})_xO_y$.

11. The liquid crystal display apparatus as set forth in claim 1, wherein the metal containing Ta and N has a dielectric constant $\epsilon_s$ and a resistivity $\rho$ which satisfy the following relationship:

$$\epsilon_s \times \rho \geq 1.9 \times 10^{12}.$$

12. A liquid crystal display apparatus comprising:
   a transparent substrate;
   driving thin film transistors disposed on said transparent substrate;
   a plurality of display picture elements, each display picture element being connected to and driven by a corresponding driving thin film transistor; and
   storage capacitance devices, each connected in parallel with a corresponding one of said plurality of display picture elements, wherein each of said storage capacitance devices includes
   a storage capacitance metallic line made of a metal containing Ta and N, said storage capacitance metallic line being disposed on said transparent substrate, and
   a metal oxide film formed by anodically oxidizing the surface of said storage capacitance metallic line, and
   wherein the corresponding display picture element is disposed on said metal oxide film, and
   wherein the metal containing Ta and N has a dielectric constant $\epsilon_s$ and a resistivity $\rho$ which satisfy the following relationship:

$$\epsilon_s \times \rho > 1.9 \times 10^{12}.$$

13. The liquid crystal display apparatus as set forth in claim 12, wherein said metal oxide of a metal contains Ta and N.

14. A liquid crystal display apparatus comprising:
a transparent substrate;
driving thin film transistors disposed on said transparent substrate;
display picture elements, each connected to a respective one of said driving thin film transistors; and
storage capacitance devices, each connected in parallel with a corresponding one of said display picture elements, wherein each of said storage capacitance devices includes
a storage capacitance metallic line made of metal layers containing Ta and N selected from Ta—N, Nb—Ta—N, Ta—Mo—N, and Ta—W—N, the metal layers laminating a Ta layer as an intermediate layer, said storage capacitance metallic line being disposed on said transparent substrate, and
a metal oxide film formed by anodically oxidizing the surface of said storage capacitance metallic line, and
wherein the corresponding one of said display picture elements is disposed on said metal oxide film.

* * * * *